(12) United States Patent
Tersac et al.

(10) Patent No.: US 12,246,658 B2
(45) Date of Patent: Mar. 11, 2025

(54) VEHICLE TRIM PANEL WITH INTEGRATED DEFORMATION SENSOR

(71) Applicant: FAURECIA INTERIEUR INDUSTRIE, Nanterre (FR)

(72) Inventors: Julien Tersac, Champcueil (FR); Adnen Nouri, Cergy (FR); Ahamed El Sayed, Chanteloup les Vignes (FR)

(73) Assignee: FAURECIA INTERIEUR INDUSTRIE, Nanterre (FR)

( * ) Notice: Subject to any disclaimer, the term of this patent is extended or adjusted under 35 U.S.C. 154(b) by 242 days.

(21) Appl. No.: 17/722,215

(22) Filed: Apr. 15, 2022

(65) Prior Publication Data

US 2022/0363205 A1 Nov. 17, 2022

(30) Foreign Application Priority Data

Apr. 15, 2021 (FR) .................. FR 21 03882

(51) Int. Cl.
 *B60R 13/02* (2006.01)
(52) U.S. Cl.
 CPC .. *B60R 13/0206* (2013.01); *B60R 2013/0287* (2013.01)
(58) Field of Classification Search
 CPC .... H01H 21/00; H01H 21/04; H01H 2003/00; H01H 2003/007; H01H 2003/02; H01H 2003/12; H01H 2009/02; H01H 2009/06; H01H 2009/20; H01H 2221/024; H01H 3/12; H01H 3/54; H01H 9/02; H01H 9/0235; H01H 9/0242; H01H 9/0264; H01H 9/04; H01H 9/20; H01H 9/22; H01H 9/24; H01H 3/04; H01H 3/14; H01H 3/50; H01H 3/52; B60R 13/02; B60R 13/0206; B60R 13/0287; B60R 2013/0287
USPC ....................................... 200/52 R
See application file for complete search history.

(56) References Cited

U.S. PATENT DOCUMENTS

| | | | |
|---|---|---|---|
| 4,074,491 | A | 2/1978 | Bell et al. |
| 4,955,772 | A | 9/1990 | Reck |
| 7,461,436 | B2 | 12/2008 | Asano et al. |
| 10,427,524 | B2 | 10/2019 | Takeno et al. |
| 2005/0160836 | A1 | 7/2005 | Hayakawa et al. |

(Continued)

FOREIGN PATENT DOCUMENTS

| | | |
|---|---|---|
| DE | 102007019901 A1 | 1/2008 |
| DE | 202017100230 U1 | 1/2017 |

OTHER PUBLICATIONS

French Search Report corresponding to French Application No. FR2103882, dated Jan. 14, 2022, 8 pages.

*Primary Examiner* — Anthony R Jimenez (57) ABSTRACT

A trim panel intended to be arranged within the interior of a vehicle cabin, the trim panel having an appearance face intended to be visible to an occupant of the cabin, a reverse face provided with an interface for attachment of the trim panel to a support member, and at least one attachment bracket forming part of the attachment interface. The appearance face defines a tactile interaction area intended to serve as a control input for the occupant, and at least one sensor assembly is arranged on an attachment bracket, each sensor assembly being adapted to, when the trim panel is arranged inside a cabin, detect a deformation of its attachment bracket upon pressure exerted by an occupant on the trim panel on the tactile interaction area.

11 Claims, 10 Drawing Sheets

(56) References Cited

U.S. PATENT DOCUMENTS

2009/0058118 A1* 3/2009 Hein .................... B60K 37/00
                                                    200/310
2020/0269698 A1   8/2020 Kang et al.
2022/0324330 A1* 10/2022 Sonwane ................ G01B 7/18

* cited by examiner

VEHICLE TRIM PANEL WITH INTEGRATED DEFORMATION SENSOR

TECHNICAL FIELD

The present disclosure relates to a trim panel intended to be arranged within the interior of a vehicle cabin, the trim panel comprising an appearance face intended to be visible to an occupant of the cabin, a reverse face provided with an interface for attachment of the trim panel to a support member, and at least one attachment bracket forming part of the attachment interface.

BACKGROUND

Figure 1:
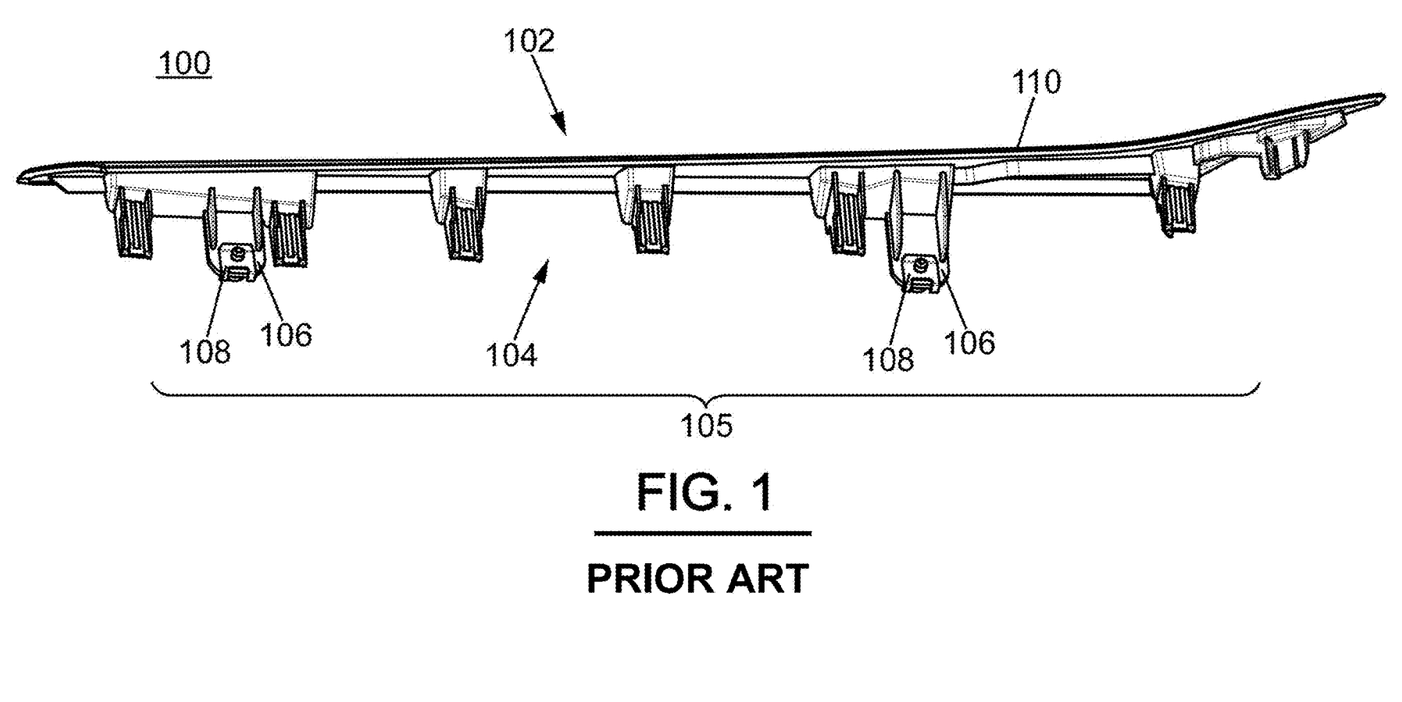
FIG. 1 is a perspective view of a trim panel according to the state of the art.

Such trim panels are known. An example is shown in FIG. 1. This is a decoration strip 100. The strip 100 essentially consists of a main body 110, on which two fasteners 108 are fitted. An appearance face 102, a reverse face 104, an interface for attachment 105 and two attachment brackets 106 are also to be distinguished.

The strip 100 has a purely decorative function. It is used to embellish the interior of the vehicle within which it is mounted.

SUMMARY

An object of the present disclosure is to modify the trim panels such as the strip 100 of FIG. 1 to make them not only a decorating element, but also a user interface allowing a passenger to control certain functions of the vehicle.

According to the present disclosure, this object is achieved with a trim panel as defined in the first paragraph above, which is characterized in that the appearance face defines a tactile interaction area intended to serve as a control means for the occupant, and at least one sensor assembly is arranged on an attachment bracket, each sensor assembly being adapted to, when the trim panel is arranged inside a cabin, detect a deformation of its attachment bracket upon pressure exerted by an occupant on the trim panel in the tactile interaction area.

Thanks to the presence of a deformation sensor on at least one attachment bracket, it becomes possible to detect a pressure applied to the appearance face. In other words, by adding one or several deformation sensors thereto, the trim panel is made sensitive to an external pressure. Thus, the trim panel may be used as an inputting means of an order from a passenger.

In addition, by choosing an attachment bracket as a location for each deformation sensor, the sensitivity of the trim panel to external pressure is maximized while at the same time minimizing the number of sensors necessary in detecting reliably the exerted pressure.

Indeed, the inventors have discovered that the deformations are concentrated on the attachment brackets upon pressure exerted on the appearance face in the mounted state of the trim panel.

The features set out in the following paragraphs can optionally be implemented, independently of each other or in combination with each other:
- each sensor assembly comprises a pressure sensor mounted on the attachment bracket thereof so as to undergo a predetermined prestress;
- each pressure sensor has a sensitive face for detecting pressure, and wherein each sensor assembly further comprises a bearing element which bears on the sensitive face of the associated pressure sensor, thus prestressing the pressure sensor;
- each bearing element is a spacer whose base is bearing on the sensitive face of the associated pressure sensor;
- each spacer is a washer, preferably made of a compressible material, such as rubber;
- each sensor assembly further includes a flexible fastener, and each bearing element is wedged between the associated pressure sensor and flexible fastener;
- each flexible fastener is provided with a retaining tongue for retaining the associated bearing element on the associated pressure sensor;
- each retaining tongue has a substantially trapezoidal section;
- each retaining tongue comprises a positioning element of the associated bearing element, such as a shaft extending within the bearing element;
- each flexible fastener comprises a stirrup for retaining the flexible fastener on the associated attachment bracket which hugs the attachment bracket on either side;
- each retaining stirrup is provided with a thread for an attachment screw;
- each sensor assembly comprises a semiconductor pressure sensor;
- each sensor assembly is arranged on an attachment bracket which is constructed to be attached to the support member by screwing;
- the trim panel has exactly two sensor assemblies which are disposed at a distance from each other, on two opposite sides of the trim panel.

The present disclosure also relates to a dashboard for a motor vehicle comprising a trim panel as defined above, the trim panel being attached to the dashboard using its attachment interface.

BRIEF DESCRIPTION OF THE DRAWINGS

Other characteristics, details and advantages will appear when reading the detailed description below, and analyzing the appended drawings, among which.

DETAILED DESCRIPTION

Figure 2:
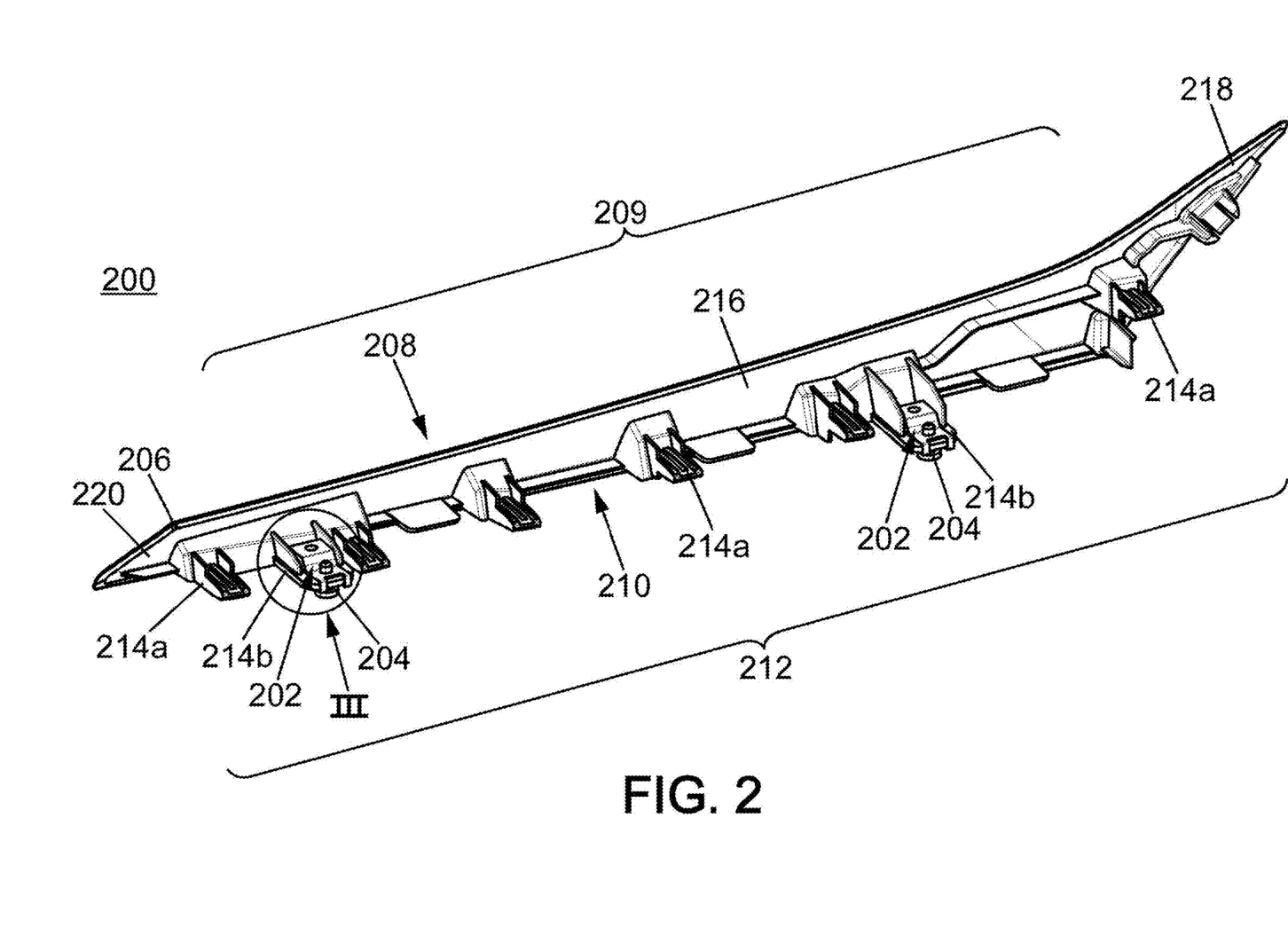
FIG. 2 is a perspective view of a trim panel according to the present disclosure.

Reference is first made to FIG. 2.

FIG. 2 is an overview of a trim panel 200 according to the present disclosure. Typically, this trim panel 200 is destined to be mounted within the cabin of a motor vehicle. It may for example be a decorating strip. Such strips are attached in cars to set up an attractive interior.

The trim panel 200 comprises two sensor assemblies 202, two attachment screws 204, as well as a main body 206.

The trim panel 200 has an appearance face 208. The latter is intended to be visible to a passenger of the motor vehicle in which the trim panel 200 is arranged.

The appearance face 208 defines a tactile interaction area 209. The latter is intended to serve as a control means for a passenger of the motor vehicle. In the view of FIG. 2, the tactile interaction area 209 is concealed. It is, however, visible in FIG. 10. It may for example be a surface provided with a control symbol P. By way of example, the tactile interaction area 209 may be provided with a triangular symbol P which indicates to the driver that the hazard lights of the car can be activated by pressing the trim panel 200 in the tactile interaction area 209.

Returning to FIG. 2, the trim panel 200 also includes a reverse face 210 which is located at the back of the appearance face 208. The reverse face 210 is provided with an interface 212 for attachment of the trim panel 200 to a support member 300 (see FIG. 10). Herein, the attachment interface 212 is in the form of a set of attachment brackets 214a, 214b. The main body 206 comprises the attachment brackets 214a, 214b, as well as a board 216 having an elongated appearance. The attachment brackets 214a, 214b are protruding from the appearance board 216. The front face of the appearance board 216 corresponds to the appearance face 208 of the trim panel 200. The tactile interaction area 209 is therefore located on the front face of the appearance board 216.

In the exemplary embodiment shown in FIG. 2, the shape of the appearance board 216 is similar to that of an airplane wing. Thus, the appearance board 216 becomes thinner, going from a widened first end 218 towards a second end 220, which is spike-shaped.

The main body 206 can be made integral. It can for example be made of plastic or of composite material. It may in particular be an injection molded part.

The attachment interface 212 preferably includes two different types of attachment brackets. The attachment brackets 214a of the first type are snap-in elements. When mounting the trim panel 200 on a support member 300, the snap-in brackets 214a are introduced into openings complementary to the support member 300 to snap thereinto.

The attachment brackets 214b of the second type are constructed to be attached to the support member by screwing. The attachment brackets 214b of the second type can therefore be qualified as being screw brackets.

It shall be noted that the trim panel 200 according to FIG. 2 is provided with exactly two sensor assemblies 202 which are disposed at a distance from each other, on two opposite sides of the trim panel. In this embodiment, one of the two sensor assemblies 202 is located in the vicinity of the spike-shaped end 220, and the other in the vicinity of the widened end 218.

The sensor assemblies 202 are arranged on the attachment brackets 214b of the second type, that is to say on the screw brackets.

Figure 3:
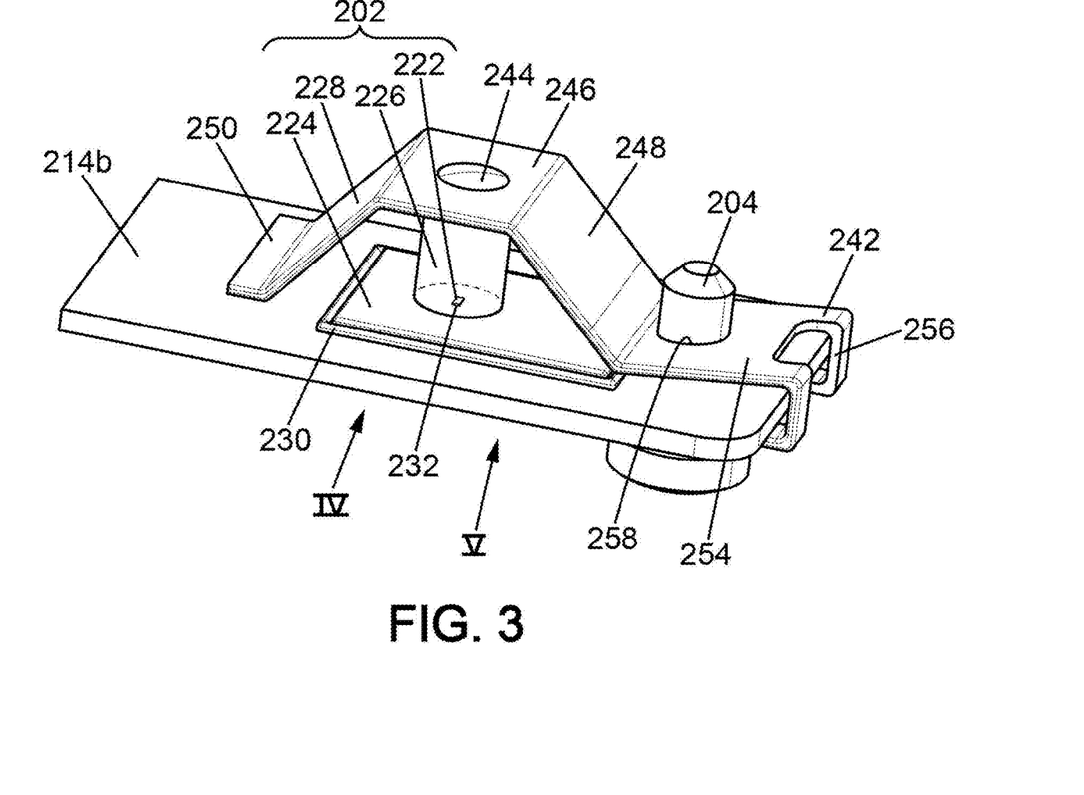
FIG. 3 is a perspective view of an attachment bracket of the trim panel of FIG. 2, with a sensor assembly.
Figure 4:
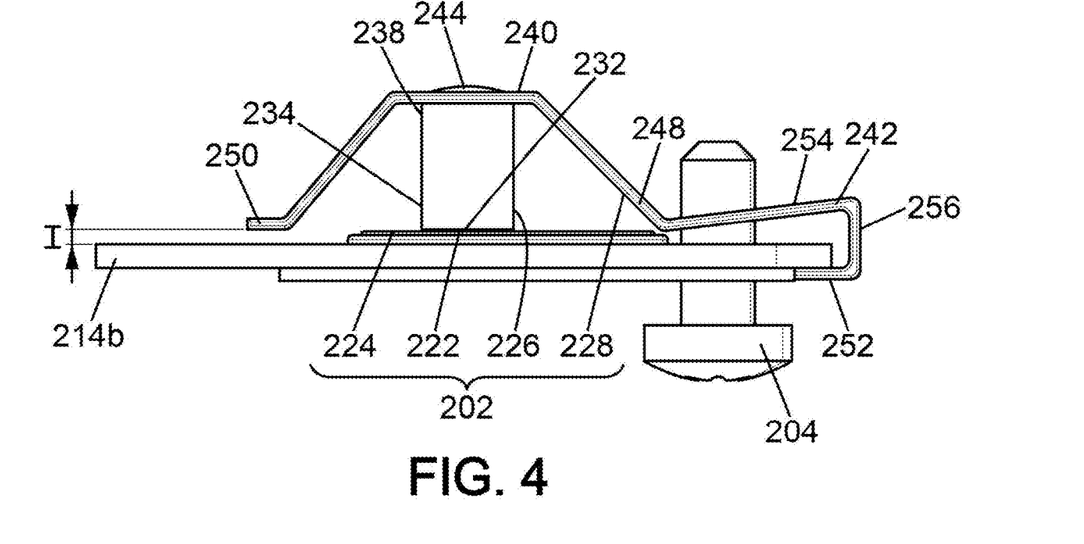
FIG. 4 is a side view, according to arrow IV of FIG. 3, of the attachment bracket with the sensor assembly.
Figure 5:
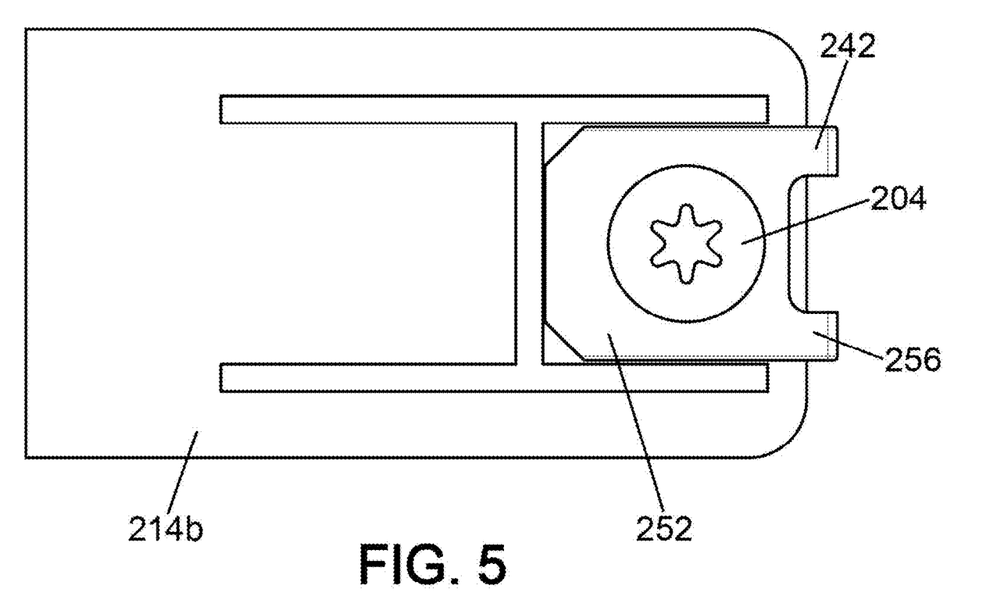
FIG. 5 is a bottom view, according to arrow V of FIG. 3, of the attachment bracket with the sensor assembly.
Figure 6:
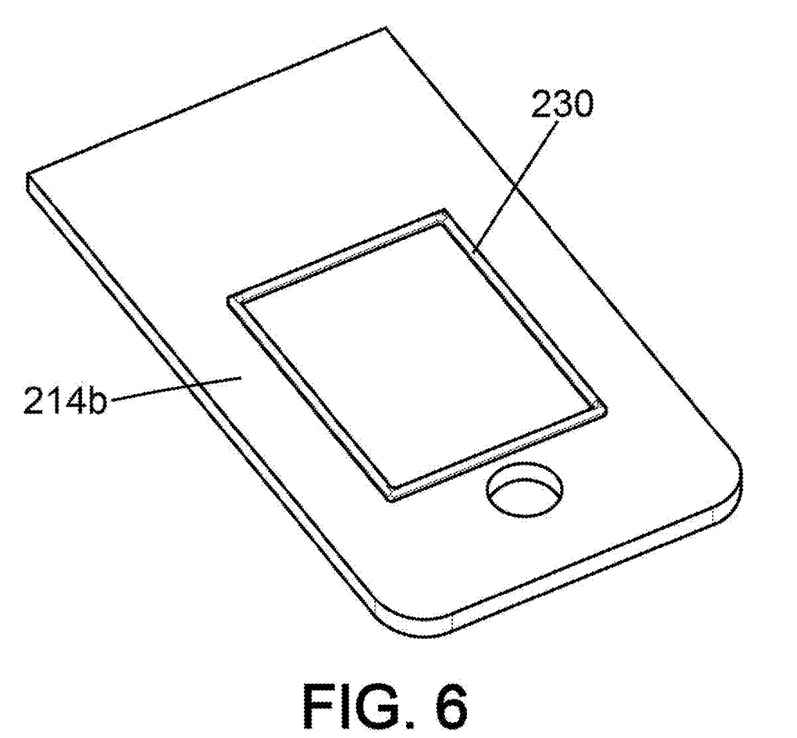
FIG. 6 is a perspective view of the attachment bracket of FIG. 3, without sensor assembly.

With reference to FIGS. 3 to 5, the structure of a sensor assembly 202 will now be described. Each sensor assembly 202 includes a pressure sensor 222, a circuit board 224, a bearing element 226, and a fastener 228. The circuit board 224 is fastened (for example glued) to a face of the screw bracket 214b. The location of the circuit board 224 on the face of the screw bracket 214b is preferably delimited by a circumferential rib 230.

Figure 7:
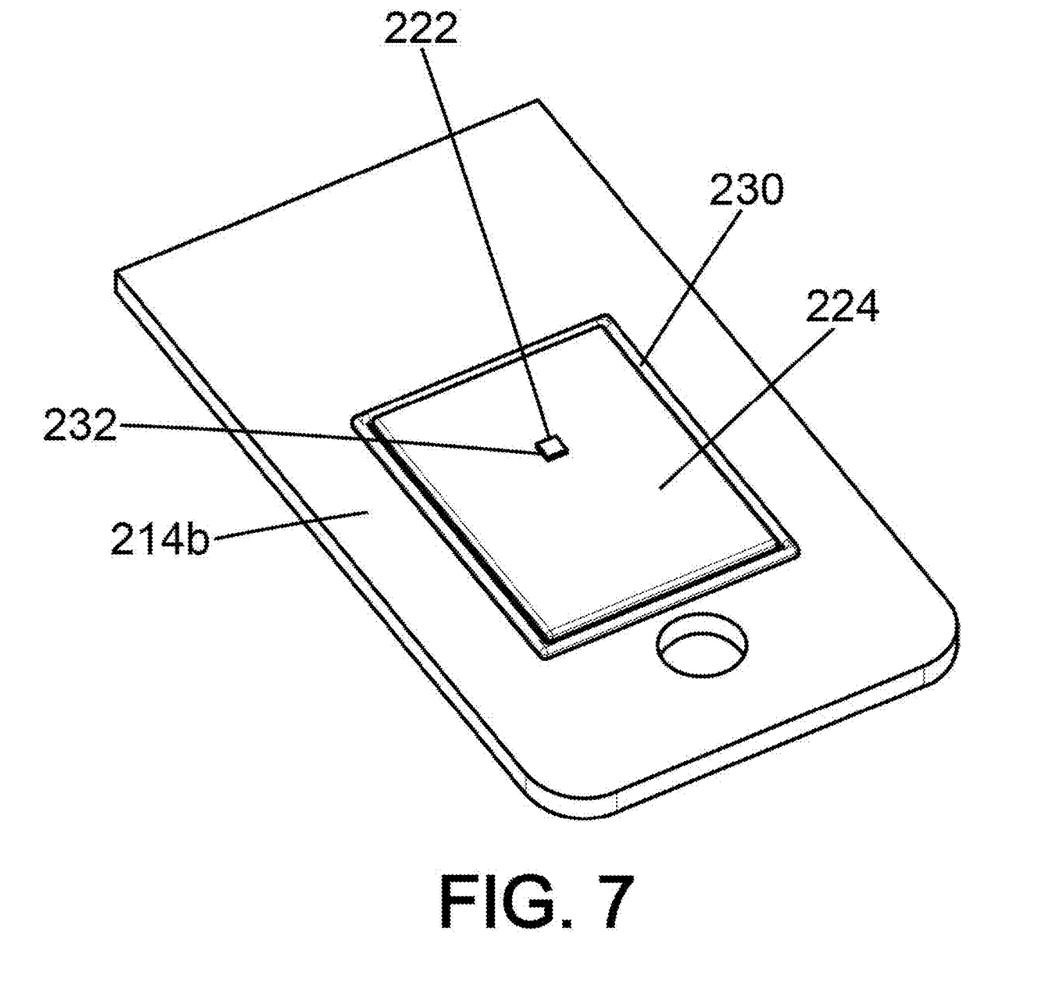
FIG. 7 is a view similar to FIG. 6, with a semiconductor pressure sensor and the circuit board thereof being added.

The pressure sensor 222 is herein in the form of a semiconductor sensor, cf. also FIG. 7. This is in particular a chip mounted on the circuit board 224. The power supply of the chip 222, as well as the transmission of the detection signal that it delivers, can be done via the circuit board 224.

The chip 222 can consist of a microelectromechanical system (or MEMS), preferably based on thin silicon layers. Advantageously, the resolution of chip 222 is of the order of a millinewton.

The pressure sensor 222 has a sensitive face 232 for detecting a pressure applied to the sensor (cf. FIG. 7). Herein, the sensitive face 232 is located in a plane which is substantially parallel to the plane defined by the screw bracket 214b. The sensitive face 232 is turned towards the fastener 228 and is located opposite the latter.

Preferably, the pressure sensor 222 is positioned substantially in the middle of the screw bracket 214b.

Figure 9:
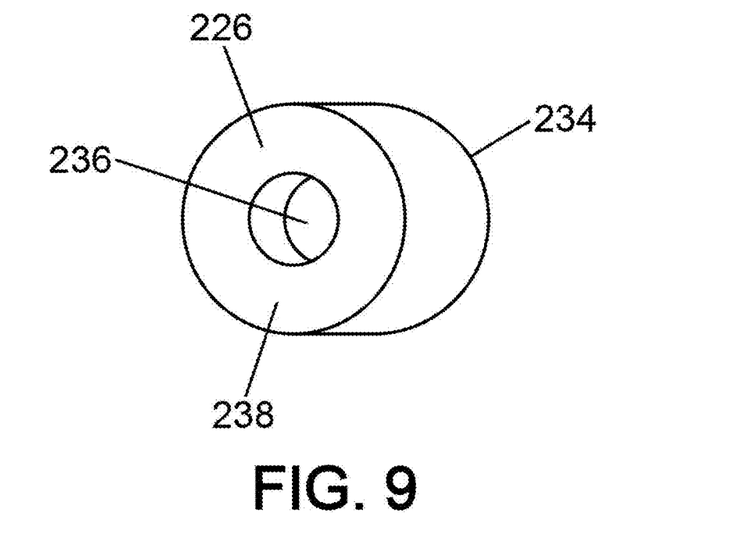
FIG. 9 is a perspective view of a bearing element of a sensor assembly according to the present disclosure.

Referring to FIGS. 3 and 4, the bearing element 226 bears against the sensitive face 232 of the pressure sensor 222, thus prestressing the pressure sensor 222. Herein, the bearing element 226 is a spacer whose base 234 is bearing on the sensitive face 232 of the associated pressure sensor 222. As shown, spacer 226 may take the form of a washer. The washer 226 is shown in perspective in FIG. 9. The washer 226 here has a cylindrical shape, but other shapes are possible. The washer 226 can be made of a compressible material, such as rubber. A recess 236 can be formed in the head 238 of the washer 226. The recess 236 serves to position and immobilize the washer 226 upon mounting thereof on the screw bracket 214b. Herein, the recess 236 is a circular and blind hole.

Figure 8:
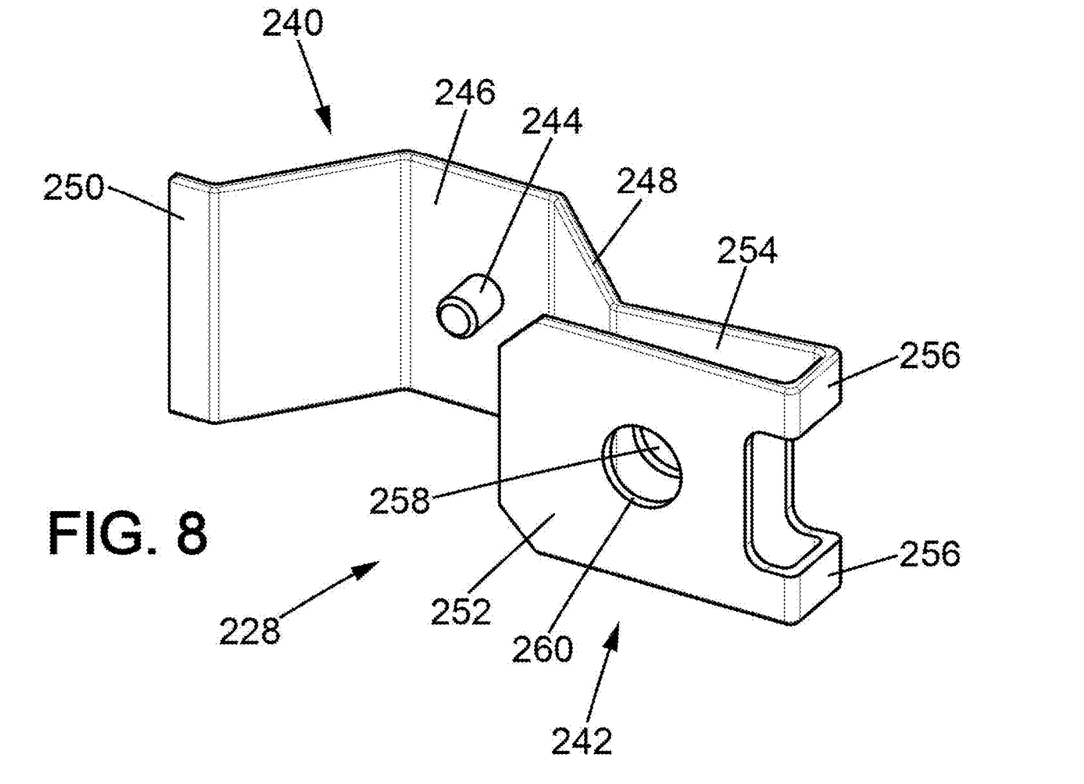
FIG. 8 is a perspective view of the fastener of a sensor assembly according to the present disclosure.

The flexible fastener 228 is shown in perspective in FIG. 8. The flexible fastener 228 includes two adjacent sections 240 and 242. The first section 240 is a retaining tongue. The second section 242 is a retaining stirrup. In the example illustrated, the tongue 240 and the stirrup 242 are integral.

Preferably, the flexible fastener 228 is made of a flexible metal, which deforms elastically.

As illustrated in FIGS. 3 and 4, the bearing element 226 is wedged between the pressure sensor 222 and the flexible fastener 228. More precisely, it is the tongue 240 which retains the bearing element 226 on the pressure sensor 222. The bearing element 226 is therefore compressed between the pressure sensor 222 and the retaining tongue 240. By its elastic properties, which oppose this compression, the bearing element 226 exerts a predetermined prestress on the sensitive face 232 of the pressure sensor 222.

Preferably, the retaining tongue 240 has a substantially trapezoidal section (cf. FIG. 4). This trapezoidal section facilitates retention and compression of the bearing element 226 on the pressure sensor 222.

Referring to FIG. 8, the retaining tongue 240 comprises an element 244 for positioning and immobilizing the bearing element 226. This is a shaft extending within the bearing element 226. This shaft 244 is housed in the blind hole 236 of the bearing element 226. The shaft 244 is here in the form of a stud located at the top 246 of the retaining tongue 240. A hole can be constructed in the top 246 of the retaining tongue 240 which accommodates the positioning stud 244. The stud 244 may be attached to the top 246 by welding.

The retaining tongue 240 has a first end 248 for junction to the stirrup 242, and a free second end 250 which is located opposed to the junction end 248. The free end 250 is located at a distance above the screw bracket 214b (cf. FIG. 4). Thanks to this gap I, and therefore the absence of linkage with the screw bracket 214b, unintentional stiffening of the screw bracket 214b is avoided.

The stirrup 242 is used to retain the fastener 228 on the screw bracket 214b. To this end, the stirrup 242 hugs the attachment bracket 214b on either side, cf. FIGS. 3 and 4. The stirrup 242 has a lower branch 252 and an upper branch 254 which are herein connected by two cross members 256. The stirrup 242 has a substantially U-shaped section. The upper branch 254 has a hole 258 passing therethrough. The hole 258 allows the passage of the shaft of an attachment screw 204. The lower branch 252 is provided with a thread 260 which allows screwing in an attachment screw 204.

As can be seen in FIGS. 4 and 5, the stirrup 242 hugs with its two upper, 254, and lower, 252, branches the free end of the screw bracket 214b. An attachment screw 204 is screwed into the thread 260 and passes through the hole 258. In this way, the sensor assembly 202 is attached on the screw bracket 214b. Adjusting the tightening of the attachment screw 204 makes it possible to increase or reduce the predetermined prestress which is applied to the pressure sensor 222.

Figure 10:
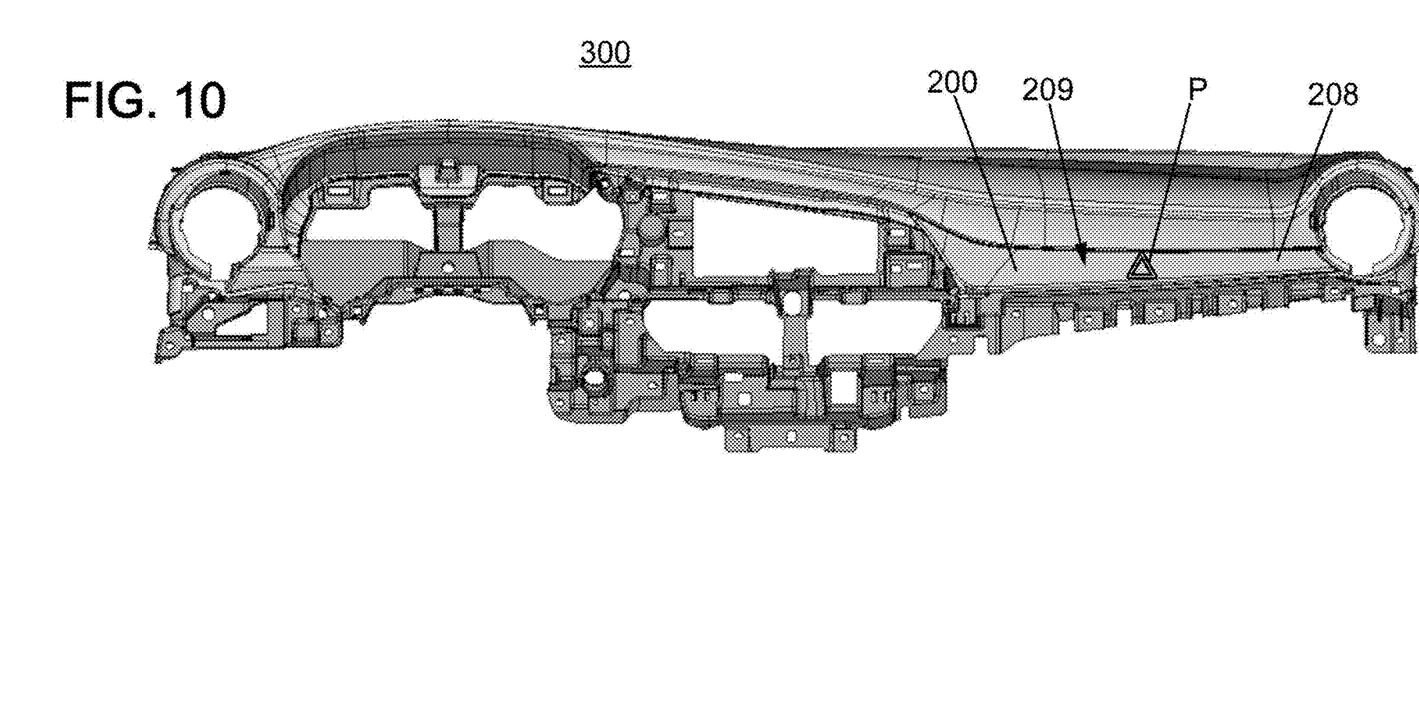
FIG. 10 is a front view of a dashboard for a motor vehicle according to the present disclosure, comprising a trim panel according to FIG. 2.
Figure 11:
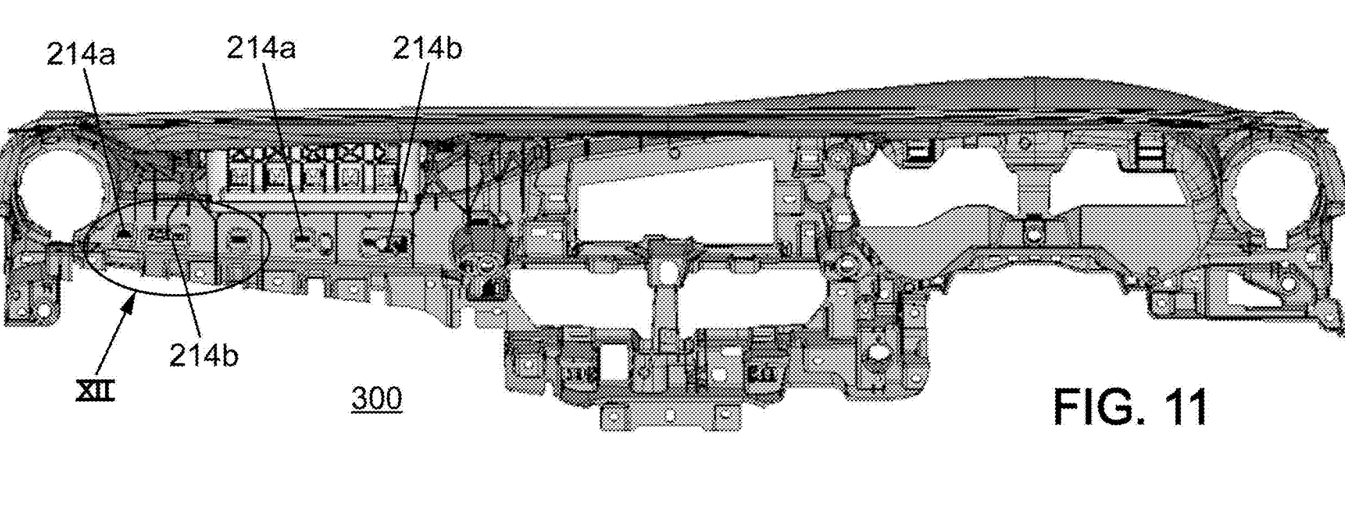
FIG. 11 is a rear view of the dashboard of FIG. 10.
Figure 12:
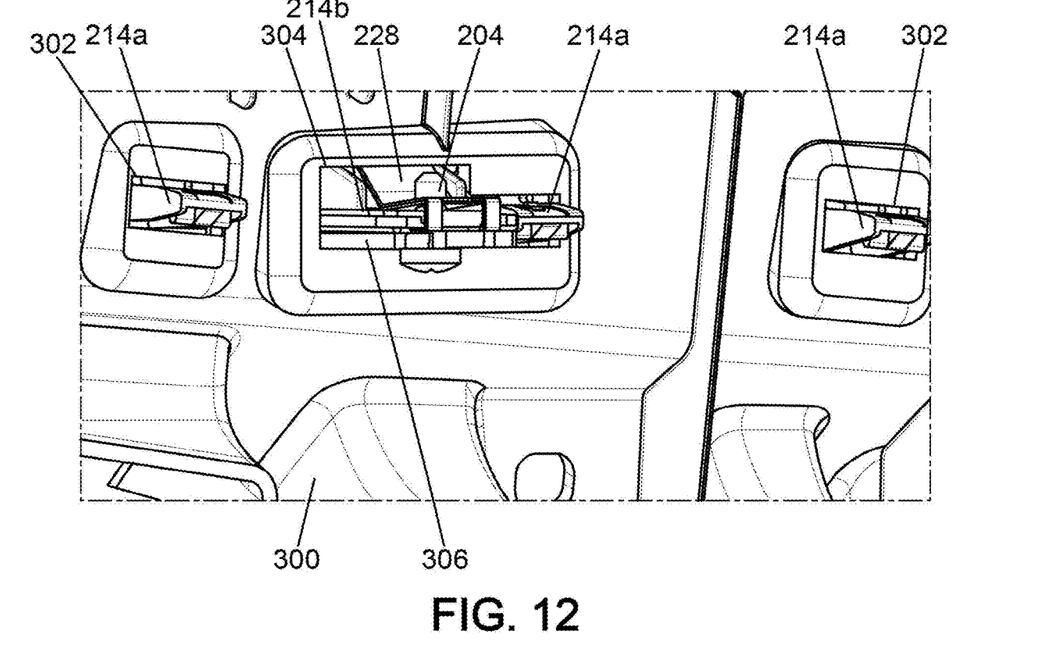
FIG. 12 is a detail view of the dashboard corresponding to the area identified by number XII in FIG. 11.

FIGS. 10 through 12 show a motor vehicle dashboard 300 according to the present disclosure, which includes the trim panel 200 previously described.

The trim panel 200 is attached to the dashboard 300 using its attachment interface 212. It can be seen that the trim panel 200 serves as a decoration strip. The latter is located herein facing the front passenger seat of the vehicle, to the right of the driver. The tactile interaction area 209 is to be distinguished from the appearance face 208. A pictogram P is drawn in the tactile interaction area 209. In this case, this is the pictogram identifying the control of the hazard lights of the motor vehicle.

The driver of the motor vehicle activates the hazard lights by pressing, with his finger, on the trim panel 200 in the tactile interaction area 209. This pressure is detected by the sensor assemblies 202.

FIGS. 11 and 12 illustrate how the trim panel 200 is attached to the dashboard 300 using the attachment brackets 214a and 214b. The snap-in brackets 214a are inserted into complementary holes 302 of the dashboard 300. The screw brackets 214b are inserted into complementary holes 304. As seen in FIG. 12, each screw tongue 214b is attached to the dashboard 300 using an attachment screw 204. More specifically, the attachment screw 204 retains, by tightening, the screw tongue 214b as well as the fastener 228 on a fork 306 located at the level of the complementary hole 304.

Figure 13:
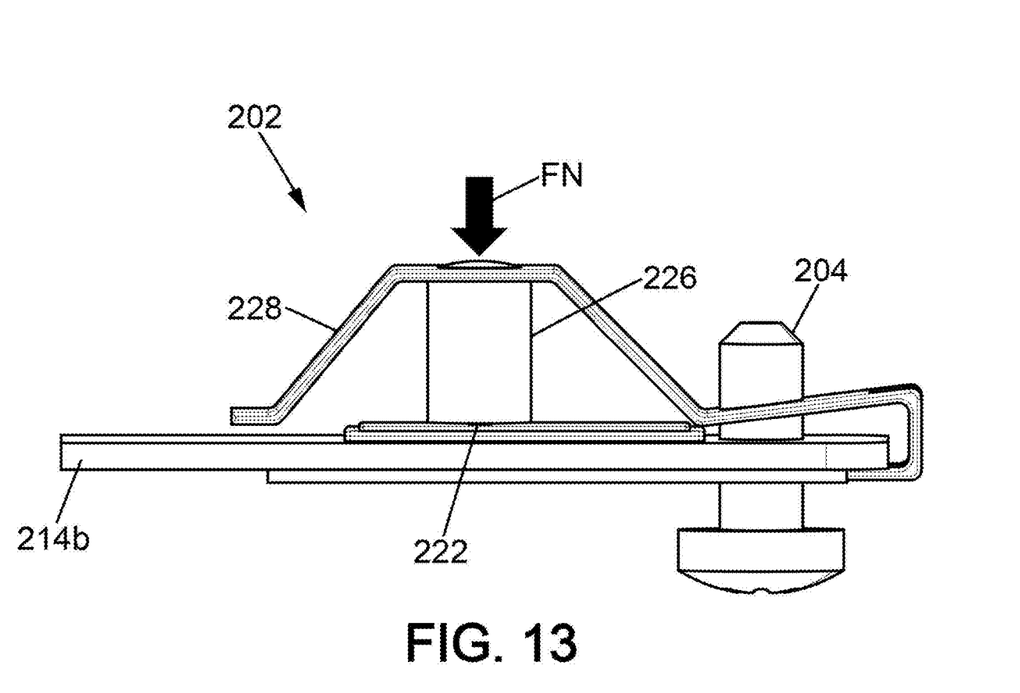
FIG. 13 is a side view of a sensor assembly according to the present disclosure, illustrating the prestress acting on the pressure sensor.
Figure 14:
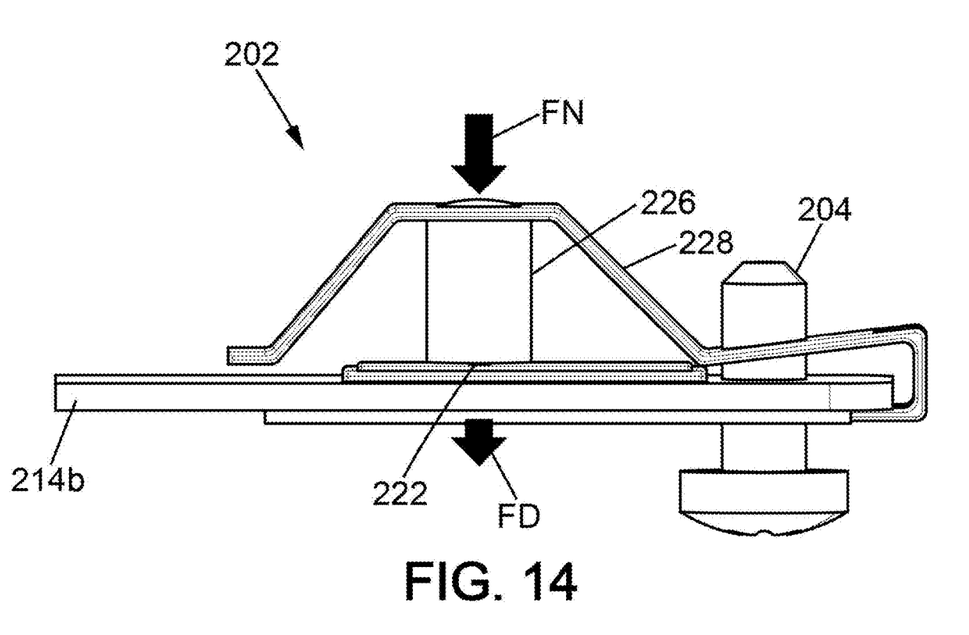
FIG. 14 is a side view of a sensor assembly according to the present disclosure, illustrating the change in stress when the attachment bracket is deformed as a result of pressure exerted on the trim panel.

With reference to FIGS. 13 and 14, the operation of the sensor assembly 202 according to the present disclosure will now be described.

FIG. 13 shows the default state, in which the pressure sensor 222 is subjected to the predetermined prestress $F_N$. This prestress force $F_N$ is illustrated by an arrow in FIG. 13. In this state, the trim panel 200 is mounted on the dashboard 300 and is at rest, without being affected by a passenger of the motor vehicle. The screw bracket 214b is not deformed. The pressure sensor 222 then measures the prestress force $F_N$. The value of this force depends on the stiffness of the bearing element 226 and the tightening of the attachment screw 204.

The actuating state of the trim panel 200 by a user is illustrated by FIG. 14. In this state, a passenger exerts pressure on the trim panel 200 in the tactile interaction area 209. For example, a passenger may press the trim panel 200 to activate the hazard lights of the motor vehicle.

The pressure applied by the passenger's finger on the trim panel 200 generates a slight elastic deformation of the screw bracket 214b. The corresponding force $F_D$ which then acts on the screw bracket 214b is illustrated by an arrow in FIG. 14. The force $F_D$ is represented physically by a force vector which goes in the same direction as the prestress force $F_N$. The force $F_D$ therefore has the effect of reducing the stress exerted on the pressure sensor 222. In other words, the elastic deformation of the screw bracket 214b results in a slight decompression of the bearing element 226. Consequently, the value of the signal delivered by the pressure sensor 222 changes. This change is interpreted as an order from the passenger, and the hazard lights of the motor vehicle are turned on.

An implementation of the sensor assembly 202 without prestress can be contemplated. However, the presence of a prestress is advantageous in that the pressure sensor 222 can then detect any elastic deformation of the screw bracket 214b with great precision, regardless of the direction of the elastic deformation.

Indeed, in the embodiment shown in the drawings, thanks to the prestress, any elastic deformation of the screw bracket 214b results either in a decompression of the bearing element 226, or in an increase in the compression of the bearing element 226, which will inevitably be detected by the pressure sensor 222.

A trim panel in accordance with the present disclosure has in particular the following advantages:

By placing a pressure sensor at the level of one or several attachment brackets of the trim panel, it is possible to detect a pressure exerted anywhere on the appearance face of the trim panel with great precision. Indeed, the inventors have discovered that such detection is even possible for trim panels with a large number of attachment points and/or having a considerable thickness, by carefully choosing the location of the pressure sensor (s). Simulations have shown that a local pressure exerted on the appearance face of such trim panels generates deformations of the trim panel which are concentrated at the level of the attachment brackets;

The number of sensors is minimized. Indeed, in the illustrated embodiment, only two pressure sensors are provided. Costs and complexity are thus reduced, in particular in comparison with solutions which consist of bonding a considerable number of deformation gauges to the reverse face of the trim panel.

In addition, the present solution is easily integrated into existing trim panels, since it requires very few modifications of the trim panel. For example, starting from the known trim panel 100 shown in FIG. 1, it suffices to modify the fasteners 108. The main body 110 can remain as it is.

The invention claimed is:

1. Trim panel for an interior of a vehicle cabin, the trim panel comprising:
    an appearance face configured to be visible to an occupant of the cabin;
    a reverse face provided with an interface for attachment of the trim panel to a dashboard; and at least one bracket forming part of the attachment interface, wherein:

the appearance face defines a tactile interaction area serving as a control means for the occupant; and by at least one sensor assembly arranged on an attachment bracket of the at least one attachment bracket, each sensor assembly being adapted to, when the trim panel is arranged inside the cabin, detect a deformation of its attachment bracket upon pressure exerted by the occupant on the trim panel in the tactile interaction area.

2. Trim panel according to claim 1, wherein each sensor assembly comprises a semiconductor pressure sensor.

3. Dashboard for a motor vehicle including the trim panel according to claim 1, the trim panel being attached to the dashboard using its interface.

4. Trim panel according to claim 1, in which each sensor assembly comprises a pressure sensor mounted on the at least one attachment bracket thereof so as to undergo a predetermined prestress.

5. Trim panel according to claim 4, wherein each pressure sensor has a sensitive face for detecting pressure, and wherein each sensor assembly further comprises a bearing element which bears on the sensitive face of the pressure sensor, thus prestressing the pressure sensor.

6. Trim panel according to claim 5, wherein each bearing element is a spacer whose base is bearing on the sensitive face of the associated pressure sensor.

7. Trim panel according to claim 5, wherein each sensor assembly further includes a flexible fastener, and wherein each bearing element is wedged between the associated pressure sensor and flexible fastener.

8. Trim panel according to claim 7, wherein each flexible fastener comprises a stirrup for retaining the flexible fastener on the associated attachment bracket which hugs the attachment bracket on either side.

9. Trim panel according to claim 7, wherein each flexible fastener is provided with a retaining tongue for retaining the associated bearing element on the associated pressure sensor.

10. Trim panel according to claim 9, wherein each retaining tongue comprises an element for positioning the associated bearing element.

11. Trim panel according to claim 10, wherein the element for positioning is a shaft extending within the bearing element.

\* \* \* \* \*